(12) United States Patent
Lai

(10) Patent No.: US 6,200,708 B1
(45) Date of Patent: Mar. 13, 2001

(54) METHOD FOR AUTOMATICALLY DETERMINING ADJUSTMENTS FOR STEPPING PHOTOLITHOGRAPHY EXPOSURES

(75) Inventor: Jun-Cheng Lai, Hsinchu (TW)

(73) Assignee: Worldwide Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 09/050,740

(22) Filed: Mar. 30, 1998

(51) Int. Cl.[7] ....................................... G03F 9/00
(52) U.S. Cl. .................................. 430/5; 430/22
(58) Field of Search ........................... 430/5, 22, 322; 356/400, 401

(56) References Cited

U.S. PATENT DOCUMENTS 5,733,690 * 3/1998 Jeong et al. .......................... 430/5
5,868,560 * 2/1999 Tamada et al. ....................... 430/5

* cited by examiner

Primary Examiner—S. Rosasco
(74) Attorney, Agent, or Firm—Blakely Sokoloff Taylor& Zafman LLP

(57) ABSTRACT

A method and system for analyzing the stepping of a reticle mask. A reticle mask includes a first and second corner mask for blocking exposure of a first rectangular area on the wafer surface, a third corner mask for blocking exposure of a second rectangular area on the wafer surface, wherein the first rectangular area is larger than the second rectangular area, and a fourth corner mask of the reticle mask for allowing exposure of a third rectangular area that is smaller than the second rectangular area. A metrology machine produces alignment adjustment values of the result of stepping the reticle mask over the wafer's surface according to reticle mask overlapped exposed corners. The alignment adjustment values comprise an x and y value, and a rotation value. The alignment adjustment values are determined from the difference between the centers of the overlapping results of the third and fourth corner mask.

7 Claims, 3 Drawing Sheets

METHOD FOR AUTOMATICALLY DETERMINING ADJUSTMENTS FOR STEPPING PHOTOLITHOGRAPHY EXPOSURES

FIELD OF THE INVENTION

The invention relates to the art of photolithography in the manufacture of semiconductor integrated circuits, and more particularly, to a process for automatically determining alignment adjustments for stepping photolithography exposures.

BACKGROUND OF THE INVENTION

In semiconductor manufacturing, the accuracy of the stepping of a reticle mask for photolithography exposures is very important. It is crucial that during each stepping action, the stepper equipment moves the reticle a precise predetermined distance in both the x and y directions. Minor accuracy errors in the exposures may produce an unusable product, particularly as the critical dimensions of features in the integrated circuits are reduced.

Currently, stepping is manually analyzed for accuracy with the aid of a microscope. The prior art manual method is time consuming because alignment is analyzed during the execution of a test pattern. Also, inaccuracies, such as rotation, may be misanalyzed due to human error.

The present invention is an improved method for insuring stepper alignment.

SUMMARY OF THE INVENTION

In accordance with this invention, a method and system for analyzing the stepping of a reticle mask is provided. The system includes a reticle mask with a first and second corner mask for blocking exposure of a first rectangular area on the wafer surface, a third corner mask for blocking exposure of a second rectangular area on the wafer surface, wherein the first rectangular area is larger than the second rectangular area, and a fourth corner mask of the reticle mask for allowing exposure of a third rectangular area that is smaller than the second rectangular area. The system also includes a metrology machine for producing alignment adjustment values of the result of stepping the reticle mask over the wafer's surface according to reticle mask overlapped exposed corners.

In accordance with other aspects of this invention, the alignment adjustment values comprise an x and y value, and a rotation value. The alignment adjustment values are determined from the difference between the centers of the overlapping results of the third and fourth corner mask.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
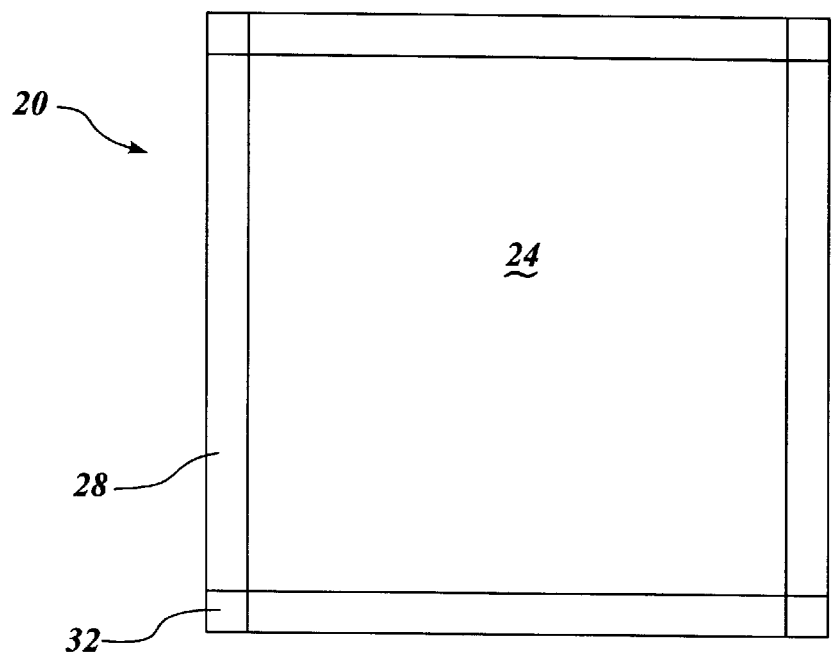
FIG. 1 is a diagram of a reticle mask formed in accordance with the present invention.

FIG. 1 is a display of a reticle mask 20 partitioned in accordance with present invention. The reticle mask has a size and die pattern, such as chrome on quartz, required to create a photoresist mask for a particular circuit layout design. The reticle mask 20 is partitioned into the following sections: a working area 24; and a border area 28 with corner areas 32. The width of the border area 28 is approximately 100 μm.

Figure 2:
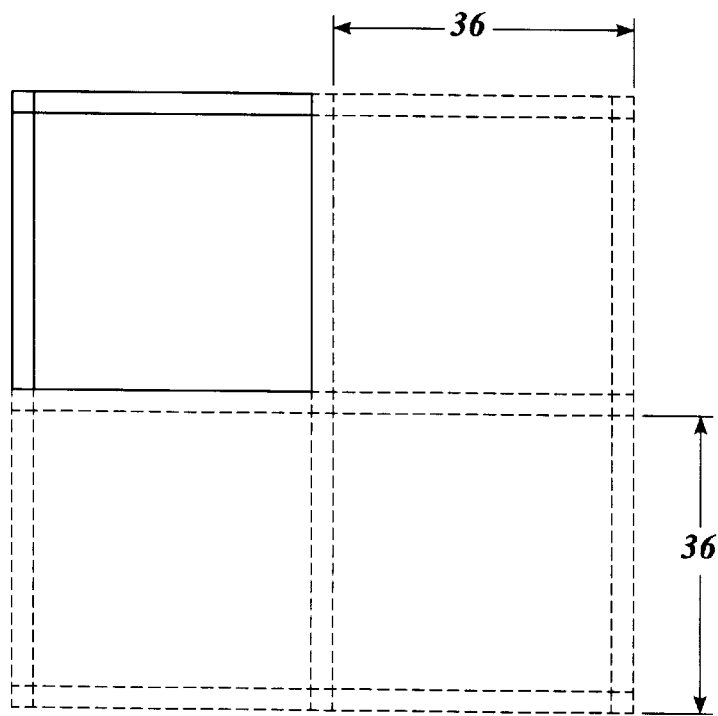
FIG. 2 is a diagram of steps of the reticle mask shown in FIG. 1.

As shown in FIG. 2, the reticle mask 20 is advanced or stepped on a wafer's surface by a stepping machine (hereinafter stepper). For each exposure the reticle mask 20 is stepped by step distance 36. Step distance 36 is not quite the length or height of the reticle mask 20, thereby causing exposed border areas 28 of adjacent exposures of the reticle masks to perfectly overlap. Thus, the step distance 36 is nominally the dimension of the working area plus the width of the border area 28. The value for the step distance 36 varies depending upon the size of the working area 24 and the border area 28. Indeed, the step distance 36 for the horizontal and vertical directions will vary also depending upon the dimensions of the working area 24. In the FIGURES, step distance 36 is equivalent in the horizontal and vertical directions because the working area 24 is a square.

Figure 3A:
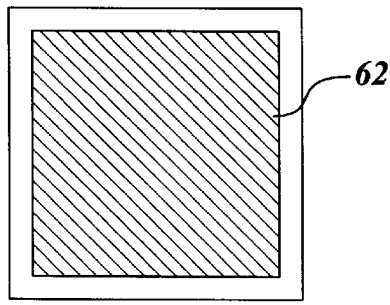
FIGS. 3A–D are diagrams of the corner masks for the reticle mask shown in FIG. 1.

At the corners of the reticle mask 20, four different mask patterns are provided. The four different corner mask patterns are shown in FIGS. 3A–D. The corner mask patterns produce the exposed wafer surface result shown in FIG. 4. As shown in FIG. 3A, one corner mask 62 masks all or nearly all of the corner area 32. The exposed result is a rectangular shape of unexposed photoresist having the same or nearly the same width and height as the border area 28.

Figure 3B:
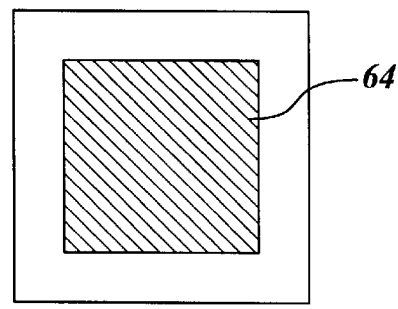
Figure 3C:
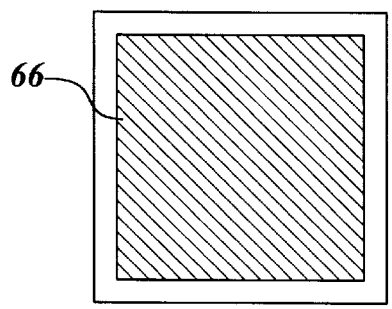
Figure 3D:
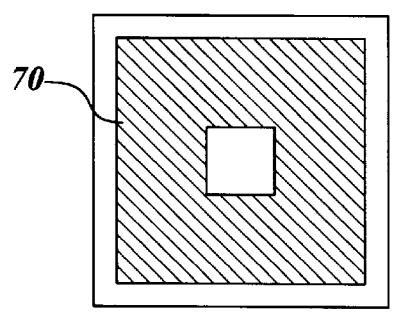

As shown in FIG. 3B, another corner mask is a rectangular shaped mask 64 with a width and length of approximately 50 μm. The exposed result of mask 64 is a rectangular area of photoresist that is smaller than the result of mask 62. As shown in FIG. 3C, the next corner mask 66 is also a full or nearly full mask that produces similar exposed results as mask 62. As shown in FIG. 3D, the last corner mask 70 produces an exposed rectangular shape with a width and length of approximately 25 μm. The corner masks, specifically masks 64 and 70, are located within the center of each corner area 32 of the reticle mask 20 (i.e., the centers for each area is co-located with the center of the respective corner). As will be readily appreciated by those of ordinary skill in the art of photoresist developing, the above masks may be changed in order to produce the same results.

Figure 4:
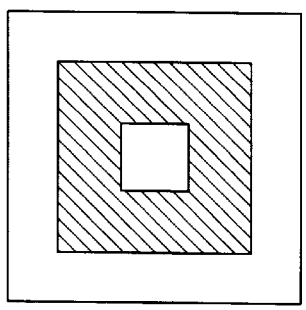
FIG. 4 is a diagram of an exposed result of the corner masks shown in FIGS. 3A–D.

When the reticle mask 20 is stepped, the corner mask patterns of FIGS. 3A–3D overlap to nominally reveal the pattern shown in FIG. 4. The horizontal and vertical step distance is preset according to the size of the reticle mask 20 in order to have the center of corners of overlapping corners be coincident. After the results of the four reticle masks 20 all sharing a common corner have been exposed and developed, the exposed corner mask result, shown in FIG. 4, is analyzed to determine if the stepping process is accurate. It should be noted that if the stepper is perfectly aligned, then the resultant final pattern on the wafer is shown in FIG. 4. However, in the event of misalignment, then the resultant pattern on the wafer will have the square regions misaligned.

Further, if the stepper is exposing a wafer in a left to right and top to bottom sequence, then it is preferred that mask pattern 62 is in the lower right corner of the reticle mask 20, mask pattern 64 is in the lower left corner of the reticle mask 20, mask pattern 66 is in the upper right corner of the reticle mask 20, and mask pattern 70 is in the upper left corner of the reticle mask 20. It can be appreciated that the location of the mask patterns in the respective corners of the reticle mask 20 is dependent upon the stepper sequence. The primary consideration is that the order of exposure of any particular corner region of the reticle mask 20 should be mask pattern 62, mask pattern 64, mask pattern 66, and mask pattern 70.

Next, a measurement or metrology tool is programmed to visually analyze and determine from the analysis the center of the undeveloped and developed photoresist areas 74 and 76. The OSI2200 or KLA5200 are examples of metrology tools for performing the analysis described herein. Their operation is well known in the art and only a brief description is provided herein. Further, the programming of these metrology tools is well known in the art and the procedures outlined below may be implemented easily by one of ordinary skill in the art.

Figure 5:
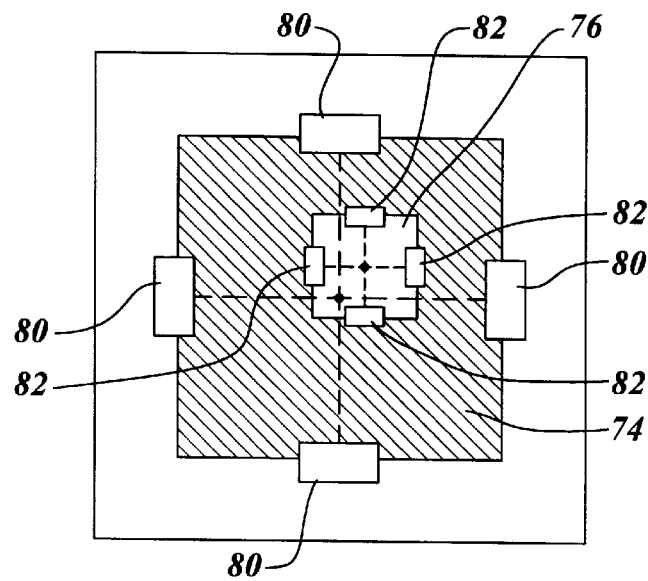
FIGS. 5 and 6 are diagrams of an analysis of a corner mask exposure.

As shown in FIG. 5, block sensors or cursors 80 and 82 produced by the metrology tool are preprogrammed to search at specific areas within the corner areas 32. The positions of the cursors 80 and 82 can be manually set. A first set of four cursors 80 are placed at an optimum location around the outside border of the undeveloped photoresist area 74. The metrology tool then determines the center of undeveloped photoresist area 74 according to what the cursors 80 visually identify. A second set of four cursors 82 are placed at an optimum location around the border of the developed photoresist area 76. The metrology tool determines the center of developed photoresist area 76 according to what the cursors 82 visually identify.

Figure 6:
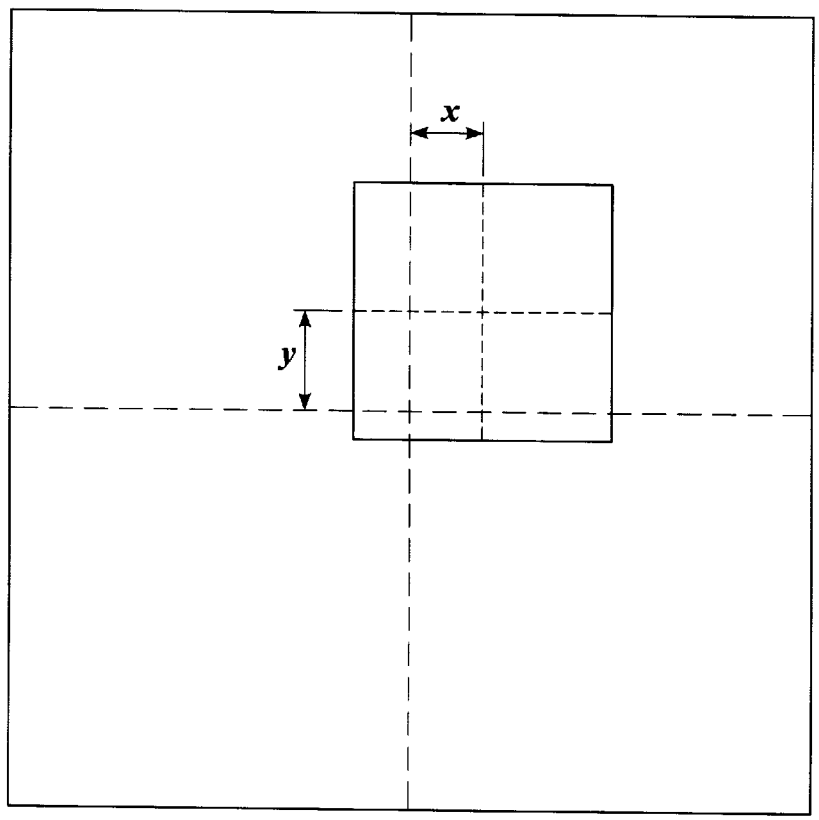

As shown in FIG. 6, after the centers for the undeveloped and developed photoresist areas 74 and 76 have been determined, the metrology tool determines the x and y variation between the two centers. A difference in x values between the two centers indicates that the stepping process has some error in lateral movement. A difference in y values between the two centers indicates that the stepping process has some error in vertical movement. The determined x and y variation is output to a technician who adjusts the stepper accordingly.

As can be readily appreciated by those of ordinary skill in the art of image analysis, many various methods or algorithms may be provided for determining the the centers of the created box areas. For example, a representation of a box area which is predetermined to be centered may be retrieved from storage when an exposed or unexposed area is to be viewed for analysis. Then, the retrieved box representation is superimposed on the viewed exposed or unexposed area and the center's location is determined. In another example, the unexposed (shaded) area shown in FIG. 4 is measured and analyzed to determine the centers' offset.

It should be noted that since steppers are generally highly accurate, the analysis, described above, occurs after approximately a lot of wafers (50) have been exposed by the same reticle.

While the preferred embodiment of the invention has been illustrated and described, it will be apparent that various changes can be made therein without departing from the spirit and scope of the invention.

The embodiments of the invention in which an exclusive property or privilege is claimed are defined as follows:

1. A stepping analysis method for analyzing the stepping of a reticle mask during exposures over the surface of a photoresist coated wafer, said method comprising:

generating a reticle mask comprising:
 a first and second corner mask of the reticle mask for blocking exposure of a first rectangular area on the wafer surface;
 a third corner mask of the reticle mask for blocking exposure of a second rectangular area on the wafer surface, wherein the first rectangular area is larger than the second rectangular area; and
 a fourth corner mask of the reticle mask for allowing exposure of a third rectangular area that is smaller than the second rectangular area, wherein the first, second, third and fourth corner masks are configured to overlap in the stepping process;

using a metrology machine for producing alignment adjustment values of the result of stepping the reticle mask over the wafer's surface according to reticle mask overlapped exposed corners.

2. The method of claim 1, wherein alignment adjustment values comprise the difference between the centers of the overlapping results of the third and fourth corner mask.

3. The method of claim 2, wherein the alignment adjustment values are determined from an x and y value, and a rotation value.

4. A reticle mask for allowing stepping analysis based on exposed and developed results of a wafer's surface according to the reticle mask, said reticle mask comprising:
 a first and second corner mask of the reticle mask for blocking exposure of a first rectangular area on the wafer surface;
 a third corner mask of the reticle mask for blocking exposure of a second rectangular area on the wafer surface, wherein the first rectangular area is larger than the second rectangular area; and
 a fourth corner mask of the reticle mask for allowing exposure of a third rectangular area that is smaller than the second rectangular area, wherein the first, second, third and fourth corner masks are configured to overlap in the stepping process.

5. A stepping analysis system for analyzing the stepping of a reticle mask during exposures over the surface of a photoresist coated wafer, said system comprising:
 a reticle mask comprising:
  a first and second corner mask of the reticle mask for blocking exposure of a first rectangular area on the wafer surface;
  a third corner mask of the reticle mask for blocking exposure of a second rectangular area on the wafer surface, wherein the first rectangular area is larger than the second rectangular area; and
  a fourth corner mask of the reticle mask for allowing exposure of a third rectangular area that is smaller than the second rectangular area, wherein the first, second, third and fourth corner masks are configured to overlap in the stepping process;
 using a metrology machine for producing alignment adjustment values of the result of stepping the reticle mask over the wafer's surface according to reticle mask overlapped exposed corners.

6. The system of claim 5, wherein the alignment adjustment values comprise an x and y value, and a rotation value.

7. The system of claim 6, wherein alignment adjustment values are determined from the difference between the centers of the overlapping results of the third and fourth corner mask.

* * * * *